United States Patent
Rutheiser

(10) Patent No.: US 10,151,803 B2
(45) Date of Patent: *Dec. 11, 2018

(54) ELECTRICAL POWER DIAGNOSTIC SYSTEM AND METHODS

(71) Applicant: The Boeing Company, Chicago, IL (US)

(72) Inventor: Joshua M. Rutheiser, Davis, CA (US)

(73) Assignee: The Boeing Company, Chicago, IL (US)

(*) Notice: Subject to any disclaimer, the term of this patent is extended or adjusted under 35 U.S.C. 154(b) by 452 days.

This patent is subject to a terminal disclaimer.

(21) Appl. No.: 14/846,749

(22) Filed: Sep. 5, 2015

(65) Prior Publication Data

US 2015/0377982 A1 Dec. 31, 2015

Related U.S. Application Data

(63) Continuation of application No. 13/351,152, filed on Jan. 16, 2012, now Pat. No. 9,157,942.

(51) Int. Cl.
| | | |
|---|---|---|
| *G01R 31/00* | (2006.01) | |
| *G01R 31/40* | (2014.01) | |
| *G01R 23/15* | (2006.01) | |
| *G01R 31/02* | (2006.01) | |
| *H01R 27/02* | (2006.01) | |
| *B64F 5/60* | (2017.01) | |

(52) U.S. Cl.
CPC .............. *G01R 31/40* (2013.01); *B64F 5/60* (2017.01); *G01R 23/15* (2013.01); *G01R 31/008* (2013.01); *G01R 31/025* (2013.01); *H01R 27/02* (2013.01)

(58) Field of Classification Search
CPC .... G01R 23/15; G01R 31/025; G01R 31/008; G01R 31/40; B64F 5/0045; H01R 27/02
USPC ........... 702/58, 60, 117, 122, 182, 188, 190; 307/139; 370/419; 439/709
See application file for complete search history.

(56) References Cited

U.S. PATENT DOCUMENTS

| | | | |
|---|---|---|---|
| 5,617,039 A | | 4/1997 | Kuck et al. |
| 5,796,185 A | * | 8/1998 | Takata ................ G06F 13/4081 307/139 |
| 9,157,942 B2 | * | 10/2015 | Rutheiser ............... G01R 31/40 |

(Continued)

FOREIGN PATENT DOCUMENTS

| | | |
|---|---|---|
| WO | 2005052617 A1 | 6/2005 |
| WO | 2010122439 A1 | 10/2010 |
| WO | 0153846 A1 | 7/2011 |

OTHER PUBLICATIONS

Extended European Search Report issued in European Patent Application No. 13151309.5 dated Jul. 6, 2016.

(Continued)

*Primary Examiner* — Stephanie Bloss
(74) *Attorney, Agent, or Firm* — McDonnell Boehnen Hulbert & Berghoff LLP

(57) ABSTRACT

An electrical power diagnostic device and methods are disclosed. A power-supply-side connector is operable to couple to a power supply, and a load-side connector is operable to couple to a load. At least one conductive path for electricity to flow between the power-supply-side connector and the load-side connector, and a diagnostic monitor is operable to monitor and change electrical properties of the power-supply-side connector and the load-side connector.

19 Claims, 5 Drawing Sheets

(56) References Cited

U.S. PATENT DOCUMENTS

| | | | |
|---|---|---|---|
| 2005/0067900 A1* | 3/2005 | Bailey | B60L 11/1816 |
| | | | 307/45 |
| 2005/0200201 A1* | 9/2005 | Jabaji | H02J 7/0032 |
| | | | 307/10.1 |
| 2006/0165110 A1* | 7/2006 | Magendanz | G06F 3/0227 |
| | | | 370/419 |
| 2008/0261459 A1* | 10/2008 | Choi | H01R 9/2466 |
| | | | 439/709 |
| 2010/0277180 A1 | 11/2010 | Kruse et al. | |
| 2011/0163776 A1 | 7/2011 | Xie | |
| 2011/0254582 A1 | 10/2011 | Partee | |

OTHER PUBLICATIONS

Chauvin Amoux Group: "Controleurs d'appareillages C.A 6150 C.A 6160", Internet Citation, Jul. 2006 (Jul. 2006), pp. 1-4, XP002493218, Retrieved from the Internet: URL:http://www.chauvin-amoux.fr/display.asp?8226 [retrieved on Aug. 22, 2008.

\* cited by examiner

ELECTRICAL POWER DIAGNOSTIC SYSTEM AND METHODS

CROSS REFERENCE TO RELATED APPLICATIONS

The present application is a continuation application of U.S. patent application Ser. No. 13/351,152, filed Jan. 16, 2012 the entire contents of which are incorporated entirely herein by reference.

GOVERNMENT RIGHTS

This invention was made with Government support under Contract No. FA8614-04-C-2004 awarded by Department of Defense. The government has certain rights in this invention.

FIELD

Embodiments of the present disclosure relate generally to electrical power monitoring. More particularly, embodiments of the present disclosure relate to a troubleshooting tool for electrical systems.

BACKGROUND

There may be many reasons a load such as an aircraft will not accept external power from an external aircraft power supply cart, hanger power, or other power supply. The power supply may be non-optimal, but generally a replacement power supply is tried or a support equipment supplier diagnoses the power supply. Sometimes, there is a problem with load power system monitoring equipment or load wiring/circuitry. There are cases where the load power system monitoring equipment has failed due to an anomaly, and been replaced with a new part which also failed due to a problem with the load wiring/circuitry. This process is tedious, takes time and resources, and sometimes results in inaccurate conclusions.

SUMMARY

An electrical power diagnostic device and methods are disclosed. A power-supply-side connector is operable to couple to a power supply, and a load-side connector is operable to couple to a load. At least one conductive path allows electricity to flow between the power-supply-side connector and the load-side connector, and a diagnostic monitors electrical properties of the power-supply-side connector and the load-side connector.

The electrical power diagnostic device can quickly determine if the power supply is out of tolerance, save troubleshooting time by allowing operators to determine a higher level cause of an anomaly before calling technicians (e.g., this could also indicate a magnitude of an issue), does not require external power to operate (e.g., comprises a battery), and can be used with various loads, among other advantages. In this manner, the electrical power diagnostic device provides necessary information to more precisely and with more expediency determine a source of an anomaly in an electronic system.

In an embodiment, an electrical power diagnostic device comprises a power-supply-side connector, a load-side connector, at least one conductive path, and a diagnostic monitor. The power-supply-side connector is operable to couple to a power supply. The load-side connector is operable to couple to a load. The at least one conductive path allows for electricity to flow between the power-supply-side connector and the load-side connector. The diagnostic monitor is operable to monitor and change electrical properties of the power-supply-side connector and the load-side connector.

In another embodiment, a method for providing an electrical power diagnostic device provides a power-supply-side connector operable to couple to a power supply, and provides a load-side connector operable to couple to a load. The method further provides at least one conductive path for electricity to flow between the power-supply-side connector and the load-side connector. The method further provides a diagnostic monitor operable to monitor and change electrical properties of the power-supply-side connector and the load-side connector.

In a further embodiment, a method for electrical power diagnostics controls at least one conductive path between a power-supply-side connector coupled to a power supply and a load-side connector coupled to a load, and monitors a first electrical property of the power-supply-side connector. The method further monitors a second electrical property of the load-side connector, and analyzes the first electrical property and the second electrical property using a diagnostic monitor coupled to the power-supply-side connector and the load-side connector.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

DETAILED DESCRIPTION

Figure 1:
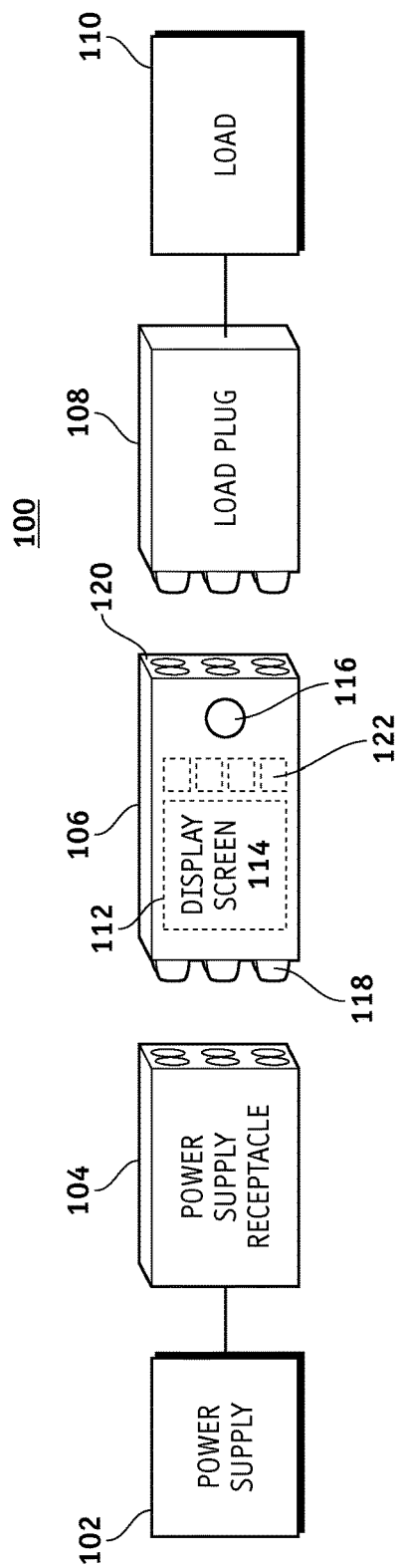
FIG. 1 is an illustration of an exemplary electrical diagnostic system according to an embodiment of the disclosure.

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to, power distribution systems, electrical systems, electrical measurements tools, and other functional aspects of the systems (and the individual operating components of the systems) may not be described in detail herein. In addition, those skilled in the art will appreciate that embodiments of the present disclosure may be practiced in conjunction with a variety of circuits, and that the embodiments described herein are merely example embodiments of the disclosure.

Embodiments of the disclosure are described herein in the context of a practical non-limiting application, namely, an electrical diagnostic tool for monitoring external power of an aircraft electrical system. Embodiments of the disclosure, however, are not limited to such aircraft electrical system applications, and the techniques described herein may also be utilized in other applications. For example but without limitation, embodiments may be applicable to ships, buildings, hospitals, factories, spacecraft, submarines, automotive vehicles, or other type of special or general purpose host platform desirable or appropriate for a given application or environment.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

Currently, aircraft operators generally do not have tools or methods for checking a ground cart and aircraft interface connectors. When an aircraft does not come online after connecting external power, an operator generally calls and waits for a technician to arrive. The technician may then bring additional support equipment and follow steps in fault isolation manuals to solve an operation anomaly. If the ground cart is out of tolerance, Aircraft Ground Equipment (AGE) personnel generally make adjustments. This process is tedious, takes time and resources, and sometimes results in inaccurate conclusions.

Embodiments of the disclosure provide an electrical diagnostic device as a troubleshooting tool for identifying a non-optimality almost immediately before more effort is expended getting a different ground cart or replacing parts on an aircraft. The troubleshooting tool not only monitors a quality of a ground cart power, but also checks the aircraft for opens and shorts which would prevent the ground cart power from being accepted or from creating an anomaly in aircraft equipment. The troubleshooting tool can be tailored for each aircraft model or have settings for each different aircraft model. The troubleshooting tool need not replace aircraft built-in monitoring, and can also be used to validate the ground cart even before it is applied to the aircraft.

Electrical measurement devices can be encapsulated in the troubleshooting tool. The troubleshooting tool can be capable of monitoring live occurrences of an anomaly and automatically determining a root cause of the anomaly. The troubleshooting tool can also be used by operators in addition or instead of by mechanics.

There are numerous advantages in utilizing the troubleshooting tool described herein instead of existing solutions. As mentioned above, the troubleshooting tool according to embodiments of the disclosure, for example but without limitation, can quickly determine if the ground cart is out of tolerance, save troubleshooting time, allow operators to determine a higher level cause of an anomaly before calling technicians (this can also indicate a magnitude of the issue), does not require any modifications to aircraft drawings or design of the ground cart, does not require external power to operate since it can operate using a portable power supply such as a battery, can be used with various loads such as an aircraft, and other advantages.

FIG. 1 is an illustration of an exemplary electrical diagnostic system (system 100) according to an embodiment of the disclosure. The system 100 may comprise: a power supply 102, a power supply receptacle 104, an electrical diagnostic device 106, a load plug 108, and a load 110.

The power supply 102 may comprise an aircraft ground cart, a portable power supply such as a battery, hanger power, or other power supply.

The electrical diagnostic device 106 (device 106) comprises a power-supply-side connector 118, and a load-side connector 120. The electrical diagnostic device 106 can be interconnected to the power supply receptacle 104 via the power-supply-side connector 118 and to the load plug 108 via a load-side connector 120. The electrical diagnostic device 106 is generally housed and packaged such that it can suitably be used on site, and does not require external power to operate since it can operate using a portable power supply such as a battery. The device 106 may comprise, for example but without limitation, a desktop, a laptop or notebook computer, a hand-held computing device (e.g., PDA, cell phone, palmtop, etc.), a server, a client, or any other type of special or general purpose computing device as may be desirable or appropriate for a given application or environment.

The electrical diagnostic device 106 also comprises a display module 112 operable to display electrical measurements and results of electrical diagnostic analysis on a display screen 114 thereof as explained in more detail below. In this manner, troubleshooting can occur on the spot without a need for additional personnel or equipment. Additionally an indicator 116 may be coupled to the electrical diagnostic device 106 to assist the operator in determining a status of the system 100. The indicator 116 may comprise, for example but without limitation, a GO/NO-GO light, a warning sound, or other indicator. For example a green/red light can be used for the GO/NO-GO light to indicate to the operator whether it is operationally optimal to apply external power from the power supply 102 to the load 110, thereby indicating the status of the system 100. The indicator 116 may be especially useful if the display module 112 is difficult to see due to, for example, rough weather.

The electrical diagnostic device 106 is also operable to determine both a magnitude of an anomaly related to the power supply 102 and whether it is operationally optimal to apply external power from the power supply 102 to components of the load 110.

The electrical diagnostic device 106 can significantly lower a Bus Power Control Unit (BPCU) retest ok (RTOK) rate. The BPCU is an external power controller used, for example, in aircraft and controls power onboard aircraft as well as external power. Using existing methods, a BPCU may be pulled from a load frequently and unnecessarily. By using the electrical diagnostic device 106 according to embodiments of the disclosure, a magnitude of an anomaly can be quickly determined, and correct actions and anomaly isolation procedures can be followed without having to remove the BPCU.

There may be a variety of external power related anomalies such as, but without limitation, short circuits due to lavatory duct leaks, short circuits due to foreign object impact, non-optimal solder connections, the power supply 102 being out of tolerance, and other electrical anomaly.

The electrical diagnostic device 106 monitors interfaces related to the anomalies mentioned above. Substantially instant feedback can be provided to the operator of the load 110, and maintenance personnel can utilize additional menus on the display screen 114 for detailed information by using menu buttons 122 to select various menu options. The electrical diagnostic device 106 can significantly decrease a time needed for maintenance, and decreases the number of maintenance personnel required to evaluate potential issues.

The load 110 may comprise for example but without limitation, a manned or unmanned aircraft, a submarine, an electronic device, a motor, a heater, a power distribution system, an appliance, an additional electrical bus, an automotive vehicle, a ship, a building, a hospital, a factory, a spacecraft, or other load.

In an embodiment, the electrical diagnostic device 106 monitors live power that is being provided to the load 110 as described in more detail below in the context of discussion of FIG. 2. In another embodiment, the load 110 is isolated from the power supply 102 and the electrical diagnostic device 106 monitors both an output of the power supply 102 at the power supply receptacle 104 and the load plug 108 coupled to the load 110 separately as described in more detail below in the context of discussion of FIG. 3.

Through the combination of live power and isolated designs, the electrical diagnostic device 106 can monitor, for example but without limitation, three phase voltages from the power supply 102, three phase frequencies from the power supply 102, phase sequence, three phase current supplied to the load 110, occurrence and location of open circuits, occurrence and location of short circuits (e.g., between pins of a connector), possible location of short or open circuit along a wire, and other diagnostic for anomaly determination.

Figure 2:
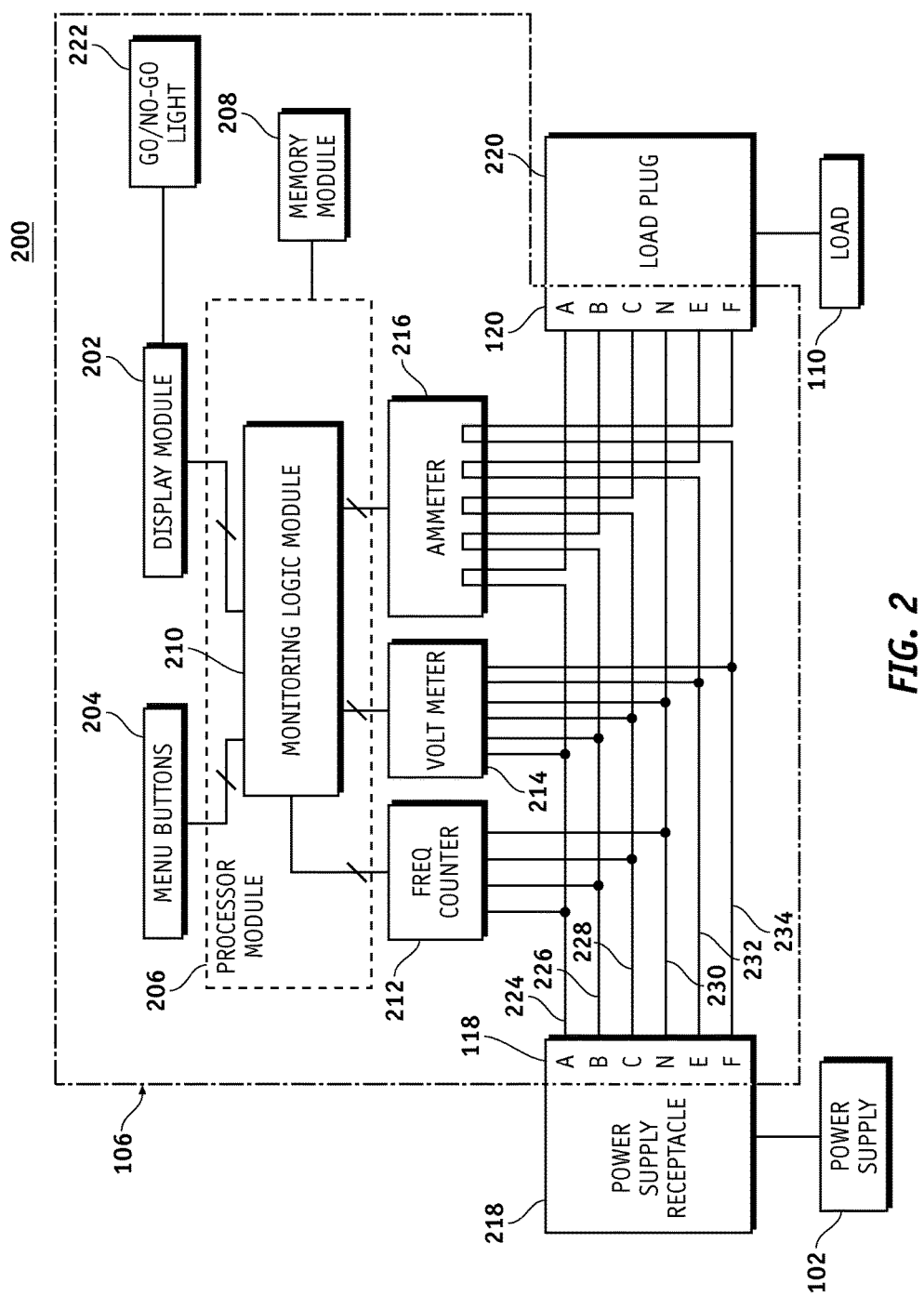
FIG. 2 is an illustration of an exemplary functional block diagram of an electrical power diagnostic system according to an embodiment of the disclosure.

FIG. 2 is an illustration of an exemplary functional block diagram of an electrical power diagnostic system 200 according to an embodiment of the disclosure. The various illustrative blocks, modules, processing logic, and circuits described in connection with the system 200 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein.

While the system 200 is applicable to a wide range of subsystems and modules of an electrical power system, an exemplary system 200 is schematically illustrated in FIG. 2. The embodiment shown in FIG. 2 may have functions, material, and structures that are similar to the embodiments shown in FIG. 1. Therefore common features, functions, and elements may not be redundantly described here.

The system 200 generally comprises the electrical diagnostic device 106 (106 in FIG. 1), the power supply 102, the load 110, a power supply receptacle 218 (104 in FIG. 1), a load plug 220 (108 in FIG. 1).

The device 106 comprises a display module 202 (112 in FIG. 1), a plurality of menu buttons 204 (122 in FIG. 1), a processor module 206, a memory module 208, a monitoring logic module 210 (diagnostic monitor 210), a frequency counter 212, a volt meter 214, an ammeter 216, and a plurality of conductive paths 224 through 234.

The device 106 measures line voltage and E-F interlock, line frequency, and line current, and calculates single line resistance of each of the conductive paths 224 through 234 as explained in more detail below. In this manner, the device 106 substantially instantly determines health of the power supply receptacle 218 coupled to the power supply 102, finds open circuits on the load 110, determines whether it is operationally optimal to apply external power from the power supply receptacle 218 to the load plug 220, determines which of conductive paths 224 through 234 (e.g., NC wiring/lines) are disconnected, and finds potential short circuits on the load 110 by calculating the line resistance.

Further, the device 106 may provide a GO/NO-GO light 222 (indicator 116 in FIG. 1) such as a green and/or a red light to inform the operator/user of a status of the device 106 such that the operator/user can determine whether to apply external power to the load 110 or not.

The display module 202 (112 in FIG. 1) is operable to present tabular and graphical information thereon. For example, the display module 202, may display, analysis results of the monitoring logic module 210. The analysis results may comprise for example but without limitation, health of the power supply receptacle 218 of the power supply 102, short circuits on the load 110, which of the conductive paths 224 through 234 are connected, whether it is operationally optimal to apply external power from the power supply receptacle 218 to the load plug 220, location on the conductive paths 224 through 234 where short or open circuit occurs, and other analysis result.

The display module 202 may comprise the display screen 114 (FIG. 1). The display screen 114 can be formed by any display technology known in the art. For example, the display screen 114 may comprise a Liquid Crystal Display (LCD) screen formed by an LCD technology.

The menu buttons 204 can be used by an operator to select various menu options on the display module 202. These functions may comprise, for example but without limitation, voltage read, set load voltage set point, set interconnect resistance, test power supply voltage, test power supply current, or other function.

The monitoring logic module 210 (diagnostic monitor 210) is operable to monitor and change electrical properties of the power supply receptacle 218 and the load plug 220 by monitoring the conductive paths 224 through 234 for electricity to flow between the power supply receptacle 218 and the load plug 220. The electrical properties may comprise, for example but without limitation, a line frequency, a line voltage, a line current, and a resistance measured across a wire of each of the conductive paths 224 through 234, and other property.

Figure 3:
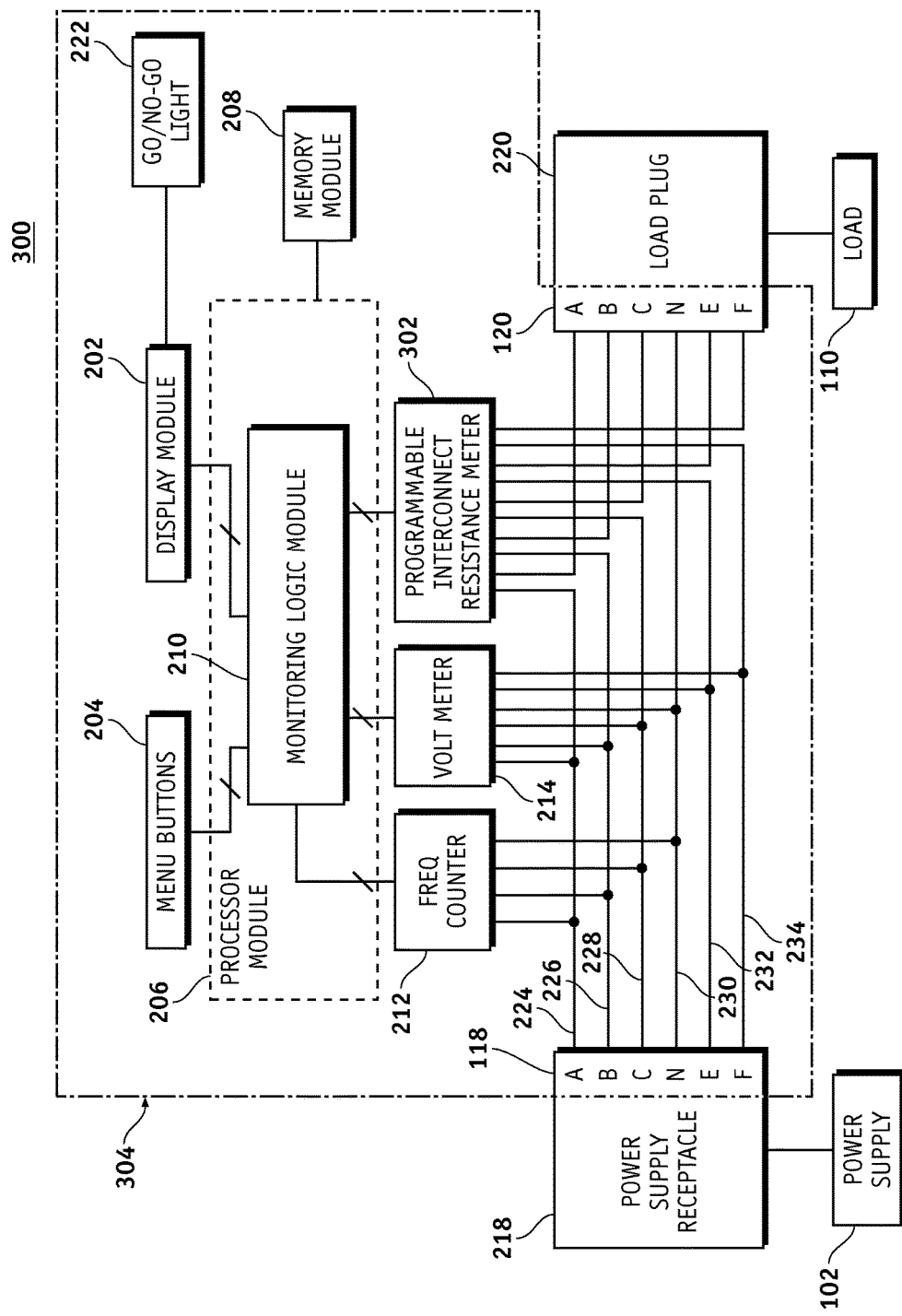
FIG. 3 is an illustration of an exemplary functional block diagram of an electrical power diagnostic system according to an embodiment of the disclosure.

The line frequency and the line voltage of each of the conductive paths 224 through 234 can be measured and set by the frequency counter 212 and the volt meter 214 respectively and monitored and changed by the diagnostic monitor 210. The line current of each of the conductive paths 224 through 234 can also be measured by the ammeter 216 respectively and monitored by the diagnostic monitor 210. Resistance across an A/C line of each of the conductive paths 224 through 234 can be measured by, for example but without limitation, an ohmmeter or other electrical resistance measurement device. In one embodiment the ohmmeter is comprised in a programmable interconnect resistance meter 302 (FIG. 3).

The diagnostic monitor 210 can change the electrical properties by sending a respective signal to the frequency counter 212 and the volt meter 214. For example, the volt meter 214 can receive a voltage step down signal from the diagnostic monitor 210 and step down the line voltage of at least one of the conductive paths 224 through 234 in response thereto until a desired voltage is obtained. The desired voltage is determined by the diagnostic monitor 210 based on operation requirement of the system 200.

The diagnostic monitor 210 also monitors the E-F interlock that essentially acts as a jumper. For example, pin E sends 28 Volt out, and pin F waits for detection before confirming that an external power source such as the power supply 102 is applied. A wire within the power supply receptacle 218 may be used to short the pin E and F together, when the power source 102 is connected to indicate to the load 110 that power supply receptacle 218 is engaged.

Additionally, the diagnostic monitor 210 calculates location on the A/C line of the conductive paths 224 through 234 where short or open circuit occurs (e.g., a distance from an electric power receptacle) using, for example but without limitation, impedance, frequency measurement, capacitive characteristics, or other open circuit detection method.

For example, the diagnostic monitor 210 analyzes a health of the power supply 102 and/or the load 110 when at least one of the conductive paths 224 through 234 is open. For another example, the diagnostic monitor 210 analyzes electrical properties of power flow when the conductive paths 224 through 234 are closed.

The frequency counter 212 is operable to measure and set the line frequency of each of the conductive paths 224 through 234.

The volt meter 214 is operable to measure and set the line voltage across each of the conductive paths 224 through 234.

The ammeter 216 is operable to measure a line current across each of the conductive paths 224 through 234.

The power-supply-side connector 118 is operable to connect to the power supply 102 via the power supply receptacle 218. The power-supply-side connector 118 comprises pins A-F that are connected to pins A-F of the load-side connector 120 via the conductive paths 224 through 234 respectively.

The load-side connector 120 is operable to couple to the load 110 via the load plug 220. The load-side connector 120 comprises pins A-F that are connected to pins A-F of the power-supply-side connector 118 via the conductive paths 224 through 234 respectively.

The processor module 206 comprises processing logic that is configured to carry out the functions, techniques, and processing tasks associated with the operation of the system 200. In particular, the processing logic is configured to support the diagnostic monitor 210 described herein.

In this manner, the processor module 206 enables users and operators of the device 106 to easily and efficiently determine both a magnitude of an external power related issue and whether it is operationally optimal to apply external power to components of the load 110.

The processor module 206 may be implemented, or realized, with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this manner, a processor may be realized as a microprocessor, a controller, a microcontroller, a state machine, or the like. A processor may also be implemented as a combination of computing devices, e.g., a combination of a digital signal processor and a microprocessor, a plurality of microprocessors, one or more microprocessors in conjunction with a digital signal processor core, or any other such configuration.

The memory module 208 may be a data storage area with memory formatted to support the operation of the device 106. The memory module 208 is configured to store, maintain, and provide data as needed to support the functionality of the device 106 in the manner described below. The data may comprise, for example but without limitation, impedance, the line frequency measurement, capacitive characteristics, the line voltage, the line current, or other electrical characteristics measured and calculated by the device 106. The data may also comprise, the voltage read, the set load voltage set point, the set interconnect resistance, the test power supply voltage, the test power supply current, or other data that may be input or selected via the menu buttons 204. In practical embodiments, the memory module 208 may comprise, for example but without limitation, a non-volatile storage device (non-volatile semiconductor memory, hard disk device, optical disk device, and the like), a random access storage device (e.g., SRAM, DRAM), or any other form of storage medium known in the art.

The memory module 208 may be coupled to the processor module 206 and configured to store, for example but without limitation, a computer program that is executed by the processor module 206, an operating system, an application program, tentative data used in executing a program, or other application. Additionally, the memory module 208 may represent a dynamically updating database containing a table for updating the data mentioned above. The memory module 208 may be coupled to the processor module 206 such that the processor module 206 can read information from and write information to the memory module 208. As an example, the processor module 206 and memory module 208 may reside in respective application specific integrated circuits (ASICs). The memory module 208 may also be integrated into the processor module 206. In an embodiment, the memory module 208 may comprise a cache memory for storing temporary variables or other intermediate information during execution of instructions to be executed by the processor module 206.

FIG. 3 is an illustration of an exemplary functional block diagram of an electrical power diagnostic system 300 according to an embodiment of the disclosure. The embodiment shown in FIG. 3 may have functions, material, and structures that are similar to the embodiments shown in FIGS. 1-2. Therefore common features, functions, and elements may not be redundantly described here.

The system 300 generally comprises the electrical diagnostic device 304 (device 106 in FIG. 1) comprising: a display module 202 (110 in FIG. 1), the plurality of menu buttons 204, the processor module 206, the memory module 208, the monitoring logic module 210, the frequency counter 212, the volt meter 214, and a programmable interconnect resistance meter 302. The system 300 also comprises the power supply receptacle 218, the load plug 220, the power supply 104 and the load 110. The system 200 and the system 300 differ in that the ammeter 216 in the device 106 of the system 200 is replaced by the programmable interconnect resistance meter 302 in the device 304 of the system 300.

The device 304 is operable to monitor both an output of the power supply 102 at the power supply receptacle 104 and an operability of the load plug 108 coupled to the load 110 separately when the load 110 is isolated from the power supply 102.

The programmable interconnect resistance meter 302 is operable to determine whether there is a short circuit between a first pin and a second pin among pins A-F of the power-supply-side connector 118 and pins A-F of the load-side connector 120 by measuring a resistance between the first pin and the second pin. When the power-supply-side connector 118 is coupled to the power supply receptacle 218, pins A-F of the power supply receptacle 218 and the power supply 104 may be checked for short circuits. When the load-side connector 120 is coupled to the power supply receptacle 218, pins A-F of the load plug 220 and the load 110 may be checked for short circuits. For example, a resistance may be measured between the pin E of the load plug 220 and the pin N of the load plug 220 to determine if there is a short between the pin E and the pin N. For another example, a resistance may be measured between the pin A of the power supply receptacle 218 and the pin B of the power supply receptacle 218 to determine if there is a short between the pin A and the pin B.

Figure 4:
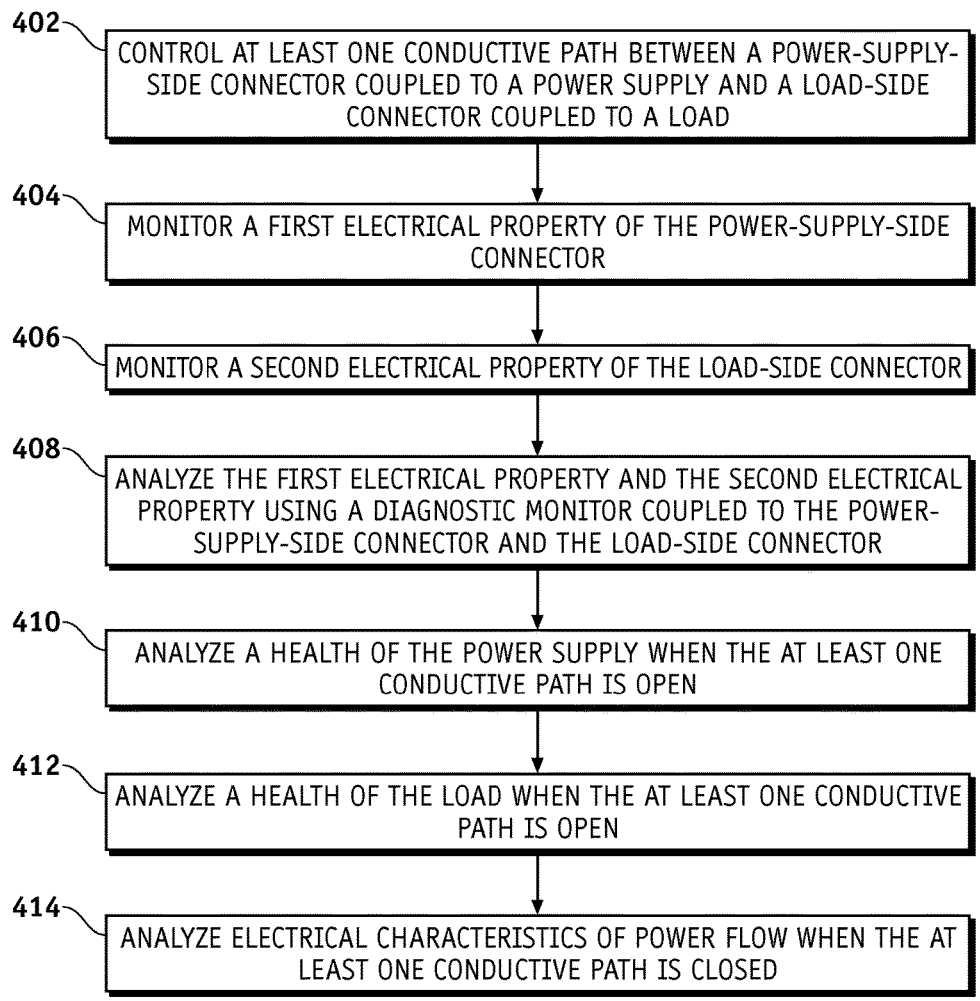
FIG. 4 is an illustration of an exemplary flowchart showing a process for an electrical power diagnostics according to an embodiment of the disclosure.

FIG. 4 is an illustration of an exemplary flowchart showing a process 400 for an electrical power diagnostics according to an embodiment of the disclosure. The various tasks performed in connection with process 400 may be performed mechanically, by software, hardware, firmware, a computer-readable medium having computer executable instructions for performing the process method, or any combination thereof. It should be appreciated that process 400 may include any number of additional or alternative tasks, the tasks shown in FIG. 8 need not be performed in the illustrated order, and process 400 may be incorporated into a more comprehensive procedure or process having additional functionality not described in detail herein.

For illustrative purposes, the following description of process 400 may refer to elements mentioned above in connection with FIGS. 1-3. In practical embodiments, portions of the process 400 may be performed by different elements of systems 100-300 such as: the power supply 102, the load 110, the power-supply-side connector 118, the load-side connector 120, the menu buttons 204, the processor module 206, the memory module 208, the monitoring logic module 210, the frequency counter 212, the volt meter 214, the ammeter 216, the power supply receptacle 218, the load plug 220, the conductive paths 224 through 234, the programmable interconnect resistance meter 302, etc. Process 400 may have functions, material, and structures that are similar to the embodiments shown in FIGS. 1-3. Therefore common features, functions, and elements may not be redundantly described here.

Process 400 may begin by controlling at least one conductive path such as the conductive paths 224-234 between a power-supply-side connector such as the power-supply-side connector 118 coupled to a power supply such as the power supply 102, and a load-side connector such as the load-side connector 120 coupled to a load such as the load 110 (task 402).

Process 400 may continue by monitoring a first electrical property of the power-supply-side connector 118 (task 404). The first electrical property may comprise, for example but without limitation, a line frequency, a line voltage, a line current, or other electrical property.

Process 400 may continue by monitoring a second electrical property of the load-side connector 120. The second electrical property may comprise, for example but without limitation, a line frequency, a line voltage, a line current, or other electrical property (task 406).

Process 400 may continue by analyzing the first electrical property and the second electrical property using a diagnostic monitor such as the diagnostic monitor 210 coupled to the power-supply-side connector 118 and the load-side connector 120 (task 408).

Process 400 may continue by analyzing a health of the power supply 102 when the at least one conductive path is open (task 410).

Process 400 may continue by analyzing a health of the load 110 when the at least one conductive path is open (task 412).

Process 400 may continue by analyzing electrical characteristics of power flow when the at least one conductive path is closed (task 414). The electrical characteristics may comprise, for example but without limitation, impedance, the line frequency, capacitive characteristics, the line voltage, the line current, or other electrical characteristics measured and calculated by the diagnostic monitor 210.

Figure 5:
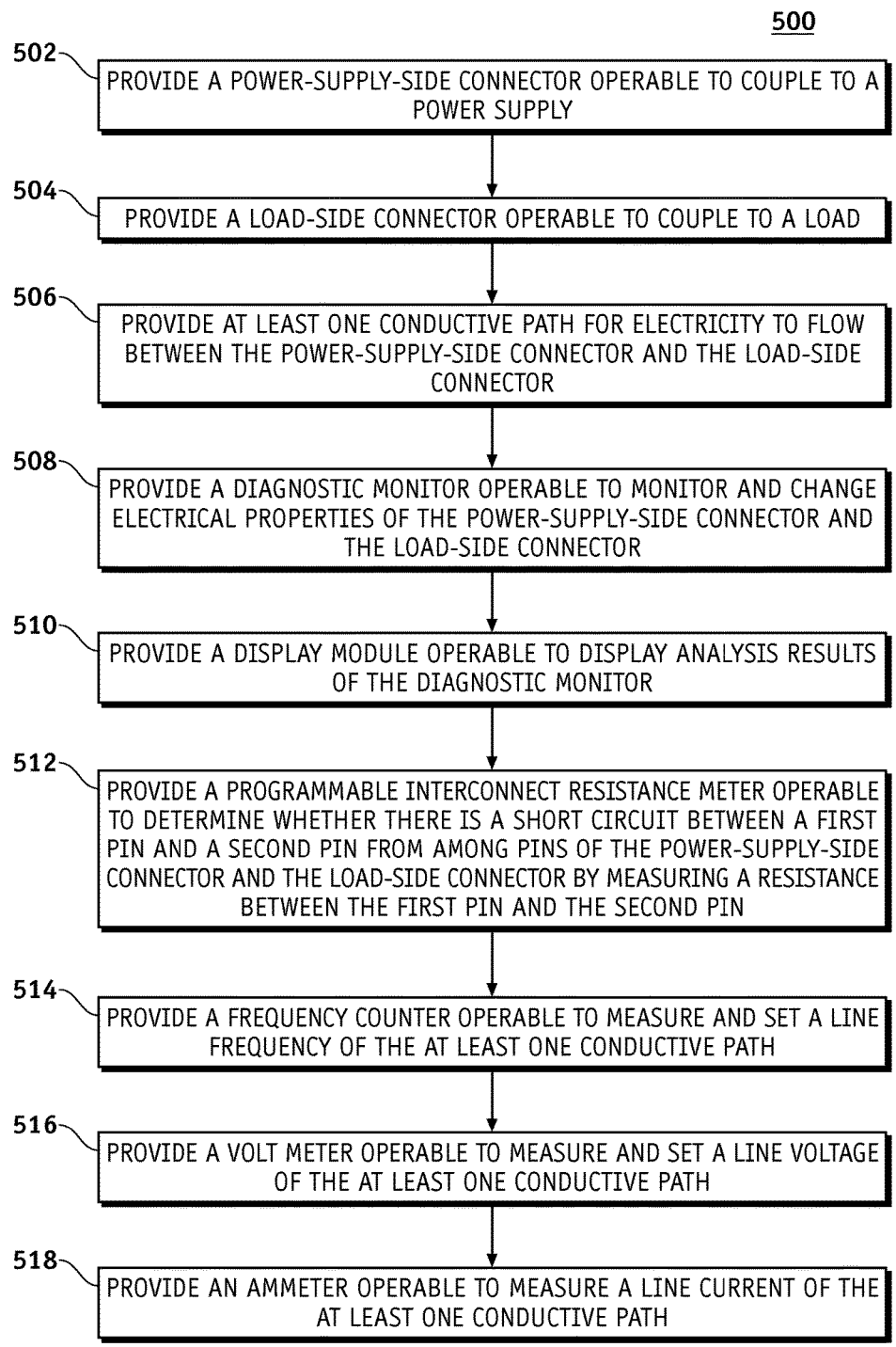
FIG. 5 is an illustration of an exemplary flowchart showing a process for providing an electrical power diagnostic device according to an embodiment of the disclosure.

FIG. 5 is an illustration of an exemplary flowchart showing a process 500 for providing an electrical power diagnostic device such as system 200-300 according to an embodiment of the disclosure. The various tasks performed in connection with process 500 may be performed mechanically, by software, hardware, firmware, a computer-readable medium having computer executable instructions for performing the process method, or any combination thereof. It should be appreciated that process 500 may include any number of additional or alternative tasks, the tasks shown in FIG. 5 need not be performed in the illustrated order, and process 500 may be incorporated into a more comprehensive procedure or process having additional functionality not described in detail herein.

For illustrative purposes, the following description of process 500 may refer to elements mentioned above in connection with FIGS. 1-3. In practical embodiments, portions of the process 500 may be performed by different elements of systems 100-300 such as: the power supply 102, the load 110, the power-supply-side connector 118, the load-side connector 120, the menu buttons 204, the processor module 206, the memory module 208, the monitoring logic module 210, the frequency counter 212, the volt meter 214, the ammeter 216, the power supply receptacle 218, the load plug 220, the conductive paths 224 through 234, the programmable interconnect resistance meter 302, etc. Process 500 may have functions, material, and structures that are similar to the embodiments shown in FIGS. 1-3. Therefore common features, functions, and elements may not be redundantly described here.

Process 500 may begin by providing a power-supply-side connector such as the power-supply-side connector 118 operable to couple to a power supply such as the power supply 102 (task 502).

Process 500 may continue by providing a load-side connector such as the load-side connector 120 operable to couple to a load such as the load 110 (task 504).

Process 500 may continue by providing at least one conductive path such as each of the conductive paths 224-234 for electricity to flow between the power-supply-side connector 118 and the load-side connector 120 (task 506).

Process 500 may continue by providing a diagnostic monitor such as the diagnostic monitor 210 operable to monitor and change electrical properties of the power-supply-side connector 118 and the load-side connector 120 (task 508).

Process 500 may continue by providing a display module such as the display module 202 operable to display analysis results of the diagnostic monitor 210 (task 510).

Process 500 may continue by providing a programmable interconnect resistance meter such as the programmable interconnect resistance meter 302 operable to determine whether there is a short circuit between a first pin and a second pin among pins A-F of the power-supply-side connector 118 and the load-side connector 120 by measuring a resistance between the first pin and the second pin (task 512).

Process 500 may continue by providing a frequency counter such as the frequency counter 212 operable to measure and set a line frequency of the at least one conductive path such as each of the conductive paths 224-234 (task 514). For example, the line frequency can be set to test if frequency variation is affecting an operation of the load 110.

Process 500 may continue by providing a volt meter such as the volt meter 214 operable to measure and set a line voltage of the at least one conductive path (task 516). For example, the line voltage can be stepped down by the volt meter 214 until a desired voltage is obtained.

Process 500 may continue by providing an ammeter such as the ammeter 216 operable to measure a line current of the at least one conductive path such as each of the conductive paths 224-234 (task 518).

In this way, embodiments of the disclosure provide an electronic troubleshooting tool to provide necessary information to more precisely and with more expediency determine a source of an anomaly in an electronic system.

In this document, the terms "computer program product", "computer-readable medium", "computer readable storage medium", and the like may be used generally to refer to media such as, for example, memory, storage devices, or storage unit. These and other forms of computer-readable media may be involved in storing one or more instructions for use by the processor module 206 to cause the processor module 206 to perform specified operations. Such instructions, generally referred to as "computer program code" or "program code" (which may be grouped in the form of computer programs or other groupings), when executed, enable an electrical diagnostic process of the systems 100-300.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-3 depict example arrangements of elements, additional intervening elements, devices, features, or components may be present in an embodiment of the disclosure.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

As used herein, unless expressly stated otherwise, "operable" means able to be used, fit or ready for use or service, usable for a specific purpose, and capable of performing a recited or desired function described herein. In relation to systems and devices, the term "operable" means the system and/or the device is fully functional and calibrated, comprises elements for, and meets applicable operability requirements to perform a recited function when activated. In relation to systems and circuits, the term "operable" means the system and/or the circuit is fully functional and calibrated, comprises logic for, and meets applicable operability requirements to perform a recited function when activated.

The invention claimed is:

1. An electrical power diagnostic device comprising:
a power-supply-side connector operable to couple to a power supply;
a load-side connector operable to couple to a load;
at least one electrically-conductive path between the power-supply-side connector and the load-side connector;
a diagnostic monitor that detects one or more electrical properties of the power-supply-side connector and the load-side connector, wherein the diagnostic monitor adjusts one or more electrical properties of the power-supply-side connector and the load-side connector based on the detected one or more electrical properties;
a display screen coupled to the diagnostic monitor and operable to display information related to the detected one or more electrical properties; and
an indicator coupled to the diagnostic monitor that, after the power-supply-side connector is coupled to the power supply and further coupled to the diagnostic monitor but before the load-side connector is coupled to the diagnostic monitor, provides a binary indication of whether or not to connect the power supply to the load via the diagnostic monitor based on the one or more detected electrical properties.

2. The electrical power diagnostic device of the claim 1, further comprising a programmable interconnect resistance meter operable to determine whether there is a short circuit between a first pin and a second pin among pins of the power-supply-side connector and the load-side connector by measuring a resistance between the first pin and the second pin.

3. The electrical power diagnostic device of the claim 1, further comprising a frequency counter operable to measure and set a line frequency of the conductive path.

4. The electrical power diagnostic device of the claim 1, further comprising a volt meter operable to measure and set a line voltage of the at least one conductive path.

5. The electrical power diagnostic device of the claim 1, further comprising an ammeter operable to measure a line current of the at least one conductive path.

6. The electrical power diagnostic device of the claim 1, wherein the power supply is an aircraft ground cart.

7. The electrical power diagnostic device of the claim 1, wherein the one or more electrical properties comprise at least one property of the at least one conductive path selected from the group consisting of: a line frequency, a line voltage, a line current, and a line resistance.

8. The electrical power diagnostic device of the claim 1, wherein the load is an aircraft accepting external power.

9. The electrical power diagnostic device of the claim 1, wherein: the power supply is one of an aircraft ground cart and a hanger power; and the load is an aircraft accepting external power.

10. The electrical power diagnostic device of the claim 1, wherein the diagnostic monitor is operable to monitor both an output of the power supply at the power-supply-side connector and an operability of the load-side connector coupled to the load separately when the load is isolated from the power supply.

11. A method comprising:
coupling a power-supply-side connector to a power supply;
coupling a load-side connector to a load;
providing at least one electrically-conductive path between the power-supply-side connector and the load-side connector;
detecting, via a diagnostic monitor, one or more electrical properties of the power-supply-side connector and the load-side connector, wherein the diagnostic monitor adjusts one or more electrical properties of the power-supply-side connector and the load-side connector based on the detected one or more electrical properties;
displaying, via a display screen coupled to the diagnostic monitor, information related to the detected one or more electrical properties;
coupling the power-supply-side connector to the diagnostic monitor;
providing an indicator coupled to the diagnostic monitor that provides a binary indication of whether or not to connect the power supply to the load based on the one or more detected electrical properties; and
in response to the indicator providing the binary indication to connect the power supply to the load, coupling the load-side connector to the diagnostic monitor to thereby provide at least one electrically-conductive path between the power-supply-side connector and the load-side connector.

12. The method of the claim 11, further comprising providing a programmable interconnect resistance meter operable to determine whether there is a short circuit between a first pin and a second pin among pins of the power-supply-side connector and the load-side connector by measuring a resistance between the first pin and the second pin.

13. The method of the claim 11, further comprising providing a frequency counter operable to measure and set a line frequency of the at least one conductive path.

14. The method of the claim 11, further comprising providing a volt meter operable to measure and set a line voltage of the at least one conductive path.

15. The method of the claim 11, further comprising providing an ammeter operable to measure a line current of the at least one conductive path.

16. A method for electrical power diagnostics comprising:
controlling at least one conductive path between a power-supply-side connector coupled to a power supply and a load-side connector coupled to a load;
monitoring a first electrical property of the power-supply-side connector;
monitoring a second electrical property of the load-side connector;
analyzing the first electrical property and the second electrical property using a diagnostic monitor coupled to the power-supply-side connector and the load-side connector;
displaying, via a display screen coupled to the diagnostic monitor, analysis results of the diagnostic monitor; and
after the power-supply-side connector is coupled to the power supply and further coupled to the diagnostic monitor but before the load-side connector is coupled to the diagnostic monitor, providing, via an indicator coupled to the diagnostic monitor, a binary indication of whether or not to connect the power supply to the load via the diagnostic monitor based on one or more of the first electrical property and the second electrical property.

17. The method of the claim 16, further comprising analyzing a health of the power supply when the at least one conductive path is open.

18. The method of the claim 16, further comprising analyzing a health of the load when the at least one conductive path is open.

19. The method of the claim 16, further comprising analyzing electrical power characteristics when the at least one conductive path is closed.

* * * * *